US012597921B2

(12) United States Patent
Nguyen et al.

(10) Patent No.: US 12,597,921 B2
(45) Date of Patent: Apr. 7, 2026

(54) SWITCHING CIRCUIT WITH A TRANSISTOR HAVING MULTIPLE PULL DOWN PATHS

(71) Applicant: Monolithic Power Systems, Inc., Kirkland, WA (US)

(72) Inventors: James Nguyen, Bellevue, WA (US); Eric Braun, Mountain View, CA (US)

(73) Assignee: Monolithic Power Systems, Inc., Kirkland, WA (US)

( * ) Notice: Subject to any disclaimer, the term of this patent is extended or adjusted under 35 U.S.C. 154(b) by 74 days.

(21) Appl. No.: 18/512,493

(22) Filed: Nov. 17, 2023

(65) Prior Publication Data

US 2025/0167780 A1 May 22, 2025

(51) Int. Cl.
*H03K 17/16* (2006.01)
*H03K 3/017* (2006.01)

(52) U.S. Cl.
CPC ........... *H03K 17/161* (2013.01); *H03K 3/017* (2013.01)

(58) Field of Classification Search
CPC .... H03K 17/161; H03K 3/017; H03K 17/162; H03K 17/164; H03K 19/00346; H03K 19/00361; H03K 19/003; H03K 19/00315; H03K 19/00369; H03K 19/00384; H03K 17/08104; H03K 17/16; H03K 17/145; H03K 17/14; H03K 17/04; H03K 17/041; H03K 17/04106; H03K 17/0416; H03K 17/04163; H03K 17/0412; H03K 17/04123; H03K 19/01; H03K 19/017; H03K 19/01707; H03K 19/01721; H03K 19/01728; H03K 19/01742
See application file for complete search history.

(56) References Cited

U.S. PATENT DOCUMENTS

| | | | |
|---|---|---|---|
| 10,840,795 B1 | 11/2020 | Nguyen | |
| 11,282,959 B2 | 3/2022 | Braun et al. | |
| 2013/0242664 A1* | 9/2013 | Shimizu | H03K 19/00361 |
| | | | 327/333 |
| 2014/0092508 A1* | 4/2014 | Ko | H02H 9/046 |
| | | | 361/56 |
| 2021/0105013 A1 | 4/2021 | Sugie | |

* cited by examiner

*Primary Examiner* — Jung Kim
(74) *Attorney, Agent, or Firm* — Perkins Coie LLP

(57) ABSTRACT

A switching circuit has a first die and a second die. The first die has a first transistor, a second transistor, and a third transistor. The second die has a fourth transistor and a driving circuit. The second transistor and the third transistor are coupled to the first transistor to provide multiple pull down paths for the first transistor. The driving circuit provides a first driving signal to control the first transistor, a second driving signal to control the fourth transistor, a first pull down control signal to control the second transistor, and a second pull down control signal to control the third transistor based on the pulse width modulation signal. A pull down strength of the first transistor is modified via the second transistor and the third transistor based on an expected turn-off mode of the first transistor.

16 Claims, 7 Drawing Sheets

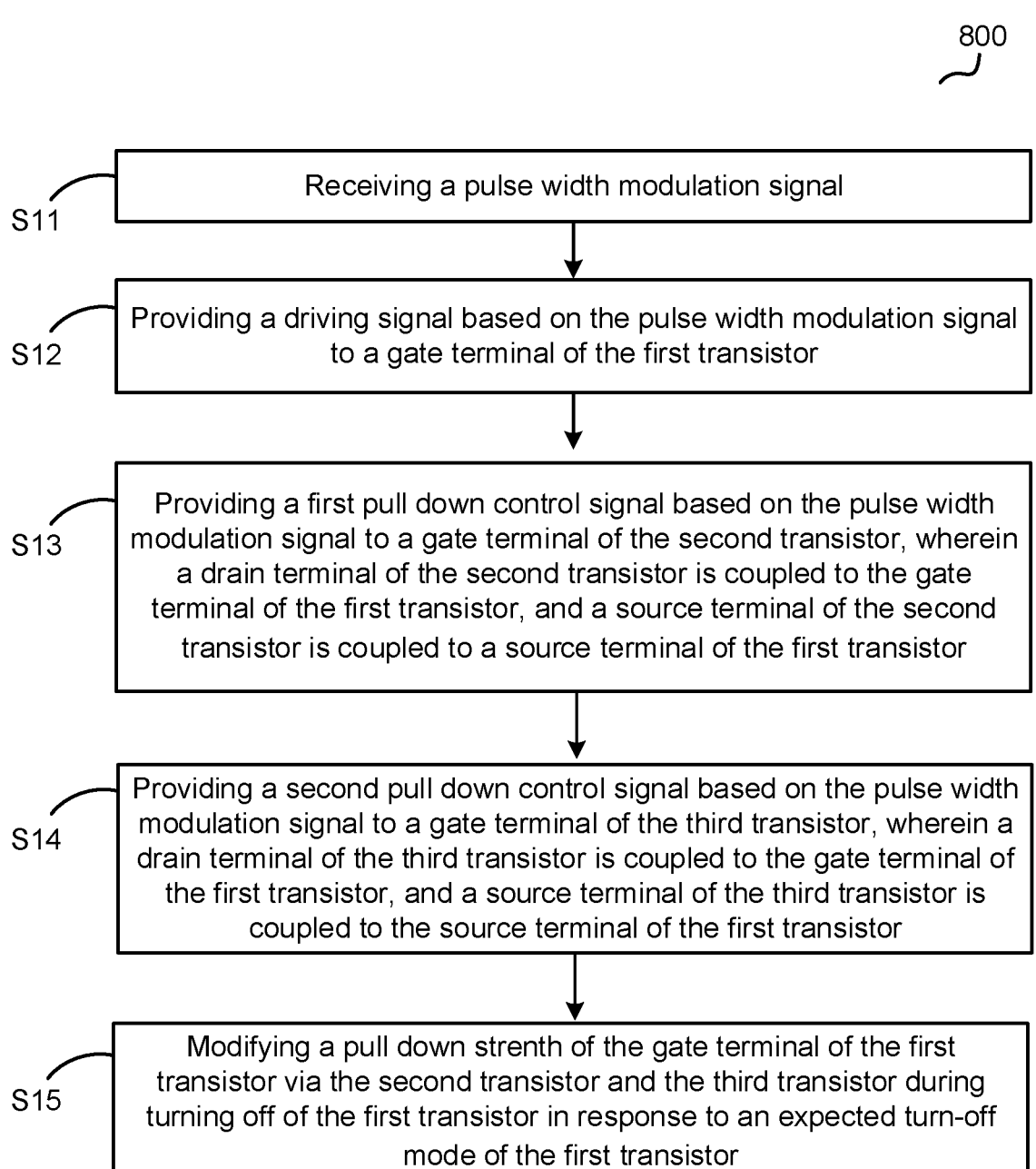

*800*

S11 — Receiving a pulse width modulation signal

S12 — Providing a driving signal based on the pulse width modulation signal to a gate terminal of the first transistor S13 — Providing a first pull down control signal based on the pulse width modulation signal to a gate terminal of the second transistor, wherein a drain terminal of the second transistor is coupled to the gate terminal of the first transistor, and a source terminal of the second transistor is coupled to a source terminal of the first transistor S14 — Providing a second pull down control signal based on the pulse width modulation signal to a gate terminal of the third transistor, wherein a drain terminal of the third transistor is coupled to the gate terminal of the first transistor, and a source terminal of the third transistor is coupled to the source terminal of the first transistor S15 — Modifying a pull down strenth of the gate terminal of the first transistor via the second transistor and the third transistor during turning off of the first transistor in response to an expected turn-off mode of the first transistor

FIG. 8

SWITCHING CIRCUIT WITH A TRANSISTOR HAVING MULTIPLE PULL DOWN PATHS

BACKGROUND OF THE INVENTION

1. Field of the Invention

The present invention generally relates to electronic circuit, and more particularly but not exclusively relates to switching circuit.

2. Description of Related Art

For switch mode power supplies, one or more discrete Field Effect Transistors (FETs) are employed with an independent gate driver. As shown in FIG. 1, a discrete FET 101 is coupled to a driver integrated circuit (IC) 102. The discrete FET 101 has a gate terminal Gate, a source terminal Source and a drain terminal Drain. The driver IC 12 is coupled to the gate terminal Gate and the source terminal Source.

However, parasitic parameters existing on a drive path (e.g., from a voltage Vg to the gate terminal Gate, and from a voltage Vs to the source terminal Source) could induce negative impact to switching operation of discrete FET 101. For example, a parasitic impedance 103, e.g., a parasitic resistance and/or a parasitic inductance, exists between the driver IC 102 and the gate terminal Gate of the discrete FET 101, and a parasitic impedance 104, e.g., a parasitic resistance and/or a parasitic inductance, exists between the driver IC 102 and the source terminal Source of the discrete FET 101.

SUMMARY OF THE INVENTION

It is one of the objects of the present invention to provide a switching circuit with a transistor having multiple pull down paths, and control method thereof.

One embodiment of the present invention discloses a switching circuit comprising a first die and a second die co-packed with the first die. The first die has a a first transistor, a second transistor, and a third transistor. The first transistor has a gate terminal configured to receive a first driving signal, a source terminal, and a drain terminal. The second transistor has a gate terminal configured to receive a first pull down control signal, a drain terminal coupled to the gate terminal of the first transistor, and a source terminal coupled to the source terminal of the first transistor. And the third transistor has a gate terminal configured to receive a second pull down control signal, a drain terminal coupled to the gate terminal of the first transistor, and a source terminal coupled to the source terminal of the first transistor. The second die has a fourth transistor and a driving circuit. The fourth transistor has a gate terminal configured to receive a second driving signal, a source terminal and a drain terminal. The driving circuit is configured to receive a pulse width modulation signal, and provide the first driving signal, the second driving signal, the first pull down control signal and the second pull down control signal based on the pulse width modulation signal. Such that during turning off of the first transistor, a pull down strength of the first transistor is capable of being modified via the second transistor and the third transistor based on an expected turn-off mode of the first transistor.

Another embodiment of the present invention discloses a switching circuit comprising a first transistor, a second transistor, a third transistor, and a driving circuit. The first transistor has a gate terminal configured to receive a first driving signal, a source terminal, and a drain terminal. A current is capable of flowing through the drain terminal and the source terminal when the first transistor is turned on. The second transistor has a gate terminal configured to receive a first pull down control signal, a drain terminal coupled to the gate terminal of the first transistor, and a source terminal coupled to the source terminal of the first transistor. The third transistor has a gate terminal configured to receive a second pull down control signal, a drain terminal coupled to the gate terminal of the first transistor, and a source terminal coupled to the source terminal of the first transistor. The driving circuit is configured to receive a pulse width modulation signal, and provide the first driving signal, the first pull down control signal and the second pull down control signal based on the pulse width modulation signal. A pull down strength of the gate terminal of the first transistor respect to time during turning off of the first transistor is capable of being modified via changing a switching sequence of the second transistor and the third transistor.

Yet another embodiment of the present invention discloses a control method for a switching circuit. Receiving a pulse width modulation signal to control a first transistor, a second transistor and a third transistor of the switching circuit. Providing a driving signal based on the pulse width modulation signal to a gate terminal of the first transistor. Providing a first pull down control signal based on the pulse width modulation signal to a gate terminal of the second transistor. A drain terminal of the second transistor is coupled to the gate terminal of the first transistor, and a source terminal of the second transistor is coupled to a source terminal of the first transistor. Providing a second pull down control signal based on the pulse width modulation signal to a gate terminal of the third transistor. A drain terminal of the third transistor is coupled to the gate terminal of the first transistor, and a source terminal of the third transistor is coupled to the source terminal of the first transistor. Modifying a pull down strength of the gate terminal of the first transistor via the second transistor and the third transistor during turning off of the first transistor in response to an expected turn-off mode of the first transistor.

These and other features of the present invention will be readily apparent to persons of ordinary skill in the art upon reading the entirety of this disclosure, which includes the accompanying drawings and claims.

BRIEF DESCRIPTION OF DRAWINGS

The present invention can be further understood with reference to the following detailed description and the appended drawings, wherein like elements are provided with like reference numerals. The drawings are only for illustration purpose, thus may only show part of the devices and are not necessarily drawn to scale.

FIG. 8 illustrates a control method 800 for a switching circuit in accordance with an embodiment of the present invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Reference to "one embodiment", "an embodiment", "an example" or "examples" means: certain features, structures, or characteristics are contained in at least one embodiment of the present invention. These "one embodiment", "an embodiment", "an example" and "examples" are not necessarily directed to the same embodiment or example. Furthermore, the features, structures, or characteristics may be combined in one or more embodiments or examples. In addition, it should be noted that the drawings are provided for illustration, and are not necessarily to scale. And when an element is described as "connected" or "coupled" to another element, it can be directly connected or coupled to the other element, or there could exist one or more intermediate elements. In contrast, when an element is referred to as "directly connected" or "directly coupled" to another element, there is no intermediate element. When a signal is described as "equal to" another signal, it is substantially identical to the other signal.

Figure 1:
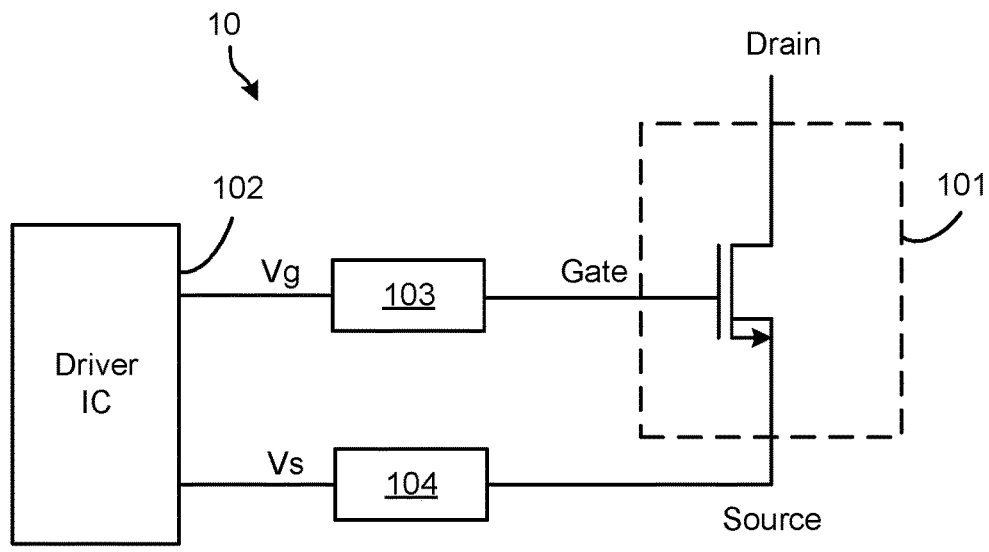
FIG. 1 shows a prior art discrete FET 10 with an independent gate driver.
Figure 2:
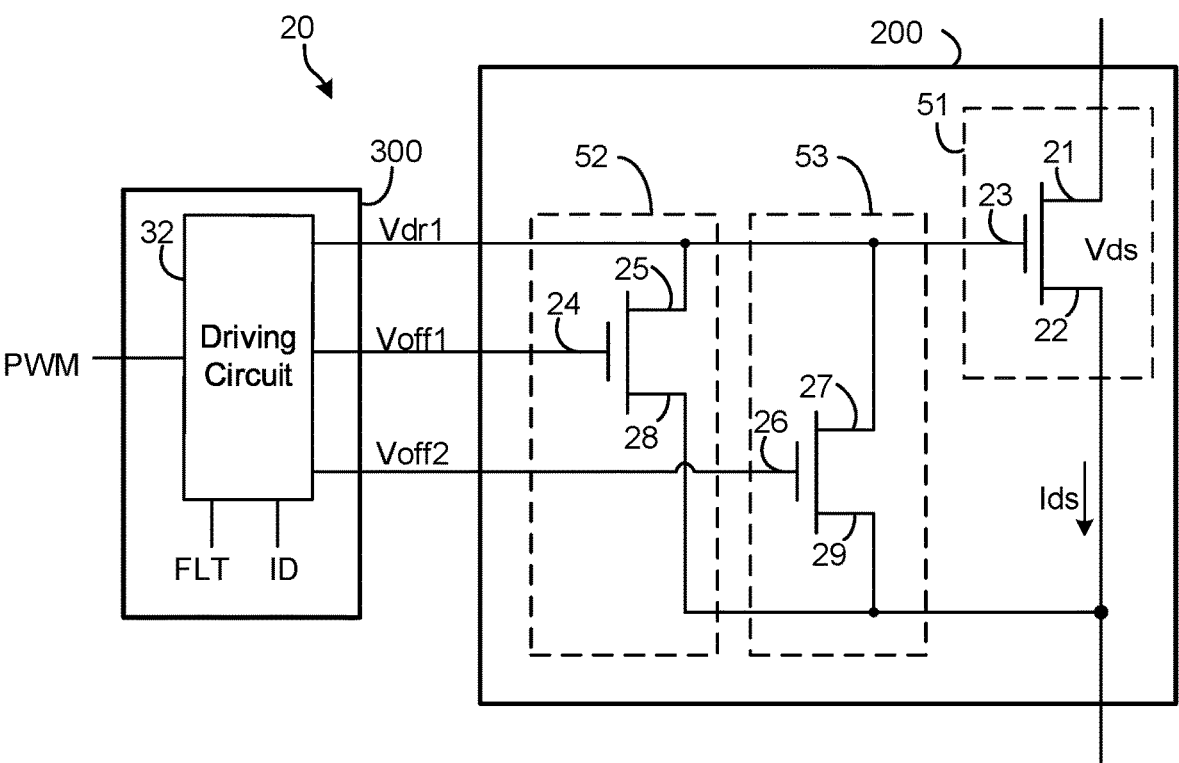
FIG. 2 schematically illustrates a switching circuit 20 in accordance with an embodiment of the present invention.

FIG. 2 schematically illustrates a switching circuit 20 in accordance with an embodiment of the present invention. The switching circuit 20 has transistors 51-53, and a driving circuit 32. The transistor 51 has a gate terminal 23 configured to receive a driving signal Vdr1, a drain terminal 21, and a source terminal 22. The transistor 52 has a gate terminal 24 configured to receive a pull down control signal Voff1, a drain terminal 25 coupled to the gate terminal 23 of the transistor 51, and a source terminal 28 coupled to the source terminal 22 of the transistor 51, and the transistor 53 has a gate terminal 26 configured to receive a pull down control signal Voff2, a drain terminal 27 coupled to the gate terminal 23 of the transistor 51, and a source terminal 29 coupled to the source terminal 22 of the transistor 51. The transistor 51 is configured to provide a power conduction path between the drain terminal 21 and the source terminal 22 when turned on, such that a current Ids could flow through the drain terminal 21 and the source terminal 22. As shown in FIG. 2, the current Ids flows out of the source terminal 22 is defined as a positive direction. The transistors 51-53 may be integrated on a die 200, and the driving circuit 32 may be integrated on a die 300. The die 200 and the die 300 may be co-packed together to form an integrated circuit (IC). In another embodiment, the transistors 51-53 and the driving circuit 32 may be integrated together on a same die. The driving circuit 32 is configured to receive a pulse width modulation signal PWM, and provide the driving signal Vdr1 and the pull down control signals Voff1-Voff2 based on the pulse width modulation signal PWM.

The transistor 52 and the transistor 53 are configured to provide multiple pull down paths for the gate terminal 23 of the transistor 51, such that the gate terminal 23 of the transistor 51 could have multiple pull down strengths during turning off. A switching sequence of the transistors 52 and 53, corresponding to turning on and turning off of the transistors 52 and 53 respectively, is configured to be modified such that the pull down strength of the gate terminal 23 of the transistor 51 respect to time is modified based on an expected turn-off mode of the transistor 51. In one embodiment, the expected turn-off mode of the transistor 51 comprises a soft turn-off mode and a normal turn-off mode. The expected turn-off mode may be related with the current Ids, a voltage Vds across the drain terminal 21 and the source terminal 22 of the transistor 51, a configuration of the transistor 51. In one embodiment, the configuration of the transistor 51 may comprise being configured as a high-side switch or a low-side switch. When configured as a high-side switch, the drain terminal 21 is coupled to an input voltage. And when configured as a low-side switch, the source terminal 22 is coupled to a reference ground.

In one embodiment, when the source terminal 22 of the first transistor 51 is configured to be coupled to the reference ground, and when the soft turn-off mode of the transistor 51 is active, two-step turn-off is expected, such that the switching sequence of the transistor 52 and the transistor 53 comprises: turning on the transistor 52 first, to pull down the gate terminal 23 of the transistor 51 through the transistor 52 with a first strength, followed by turning on the transistor 53 after a time period, to pull down the gate terminal 23 of the transistor 51 through both transistors 52 and 53 with a second strength. The second strength is higher than the first strength. In another embodiment, when the drain terminal 21 is configured to be coupled to the input voltage, and when the soft turn-off mode of the transistor 51 is active, three-step turn-off is expected, such that the switching sequence of the transistor 52 and the transistor 53 comprises: turning on both the transistors 52 and 53 first, to pull down the gate terminal 23 of the transistor 51 with a highest strength, followed by turning off one of the transistor 52 and the transistor 53 temporarily after a time period to pull down the gate terminal 23 of the transistor 51 with a reduced strength, and finally turning on the one of the transistor 52 and the transistor 53 again to pull down the gate terminal 23 of the transistor 51 with the highest pull down strength. In another embodiment, in response to the normal turn-off mode, the switching sequence of the transistor 52 and the transistor 53 comprises: turning on both the transistors 52 and 53, and finally turning off both transistors 52 and 53. In one embodiment, the soft turn-off mode of the transistor 51 is active based on the current Ids and/or a voltage Vds across the drain terminal 21 and the source terminal 22 of the transistor 51. As shown in FIG. 2, the driving circuit 32 is configured to determine the expected turn-off mode of the transistor 51 based on a current indicating signal ID and a fault indicating signal FLT. The current indicating signal ID is employed to indicate that if the current Ids is larger than a current threshold, and the fault indicating signal FLT is employed to indicate that if the voltage Vds is larger than a voltage threshold.

In one embodiment, the transistor 52 and the transistor 53 could have identical device construction as the transistor 51, excepting the possibility to reduce some device layout sizing. For example, the transistor 52 and the transistor 53 respectively are typically several orders of magnitude smaller conductance and area than the transistor 51. In one embodiment, the transistor 52 has smaller size than the transistor 53, and the transistor 52 has larger on-resistance than the transistor 53.

Embodiments of the present invention is to integrate more than one pull down transistors (e.g., 52, 53) with the transistor 51, to connect the gate terminal 23 with the source terminal 22 of the transistor 51 through at least one of the pull down transistors during turning off the transistor 51, and the pull down strength of the gate terminal 23 respect to time can be automatically modulated via setting different switching sequence of the transistors 52 and 53 by the pull down control signals Voff1 and Voff2 based on the expected turn-off mode of the transistor 51.

Figure 3:
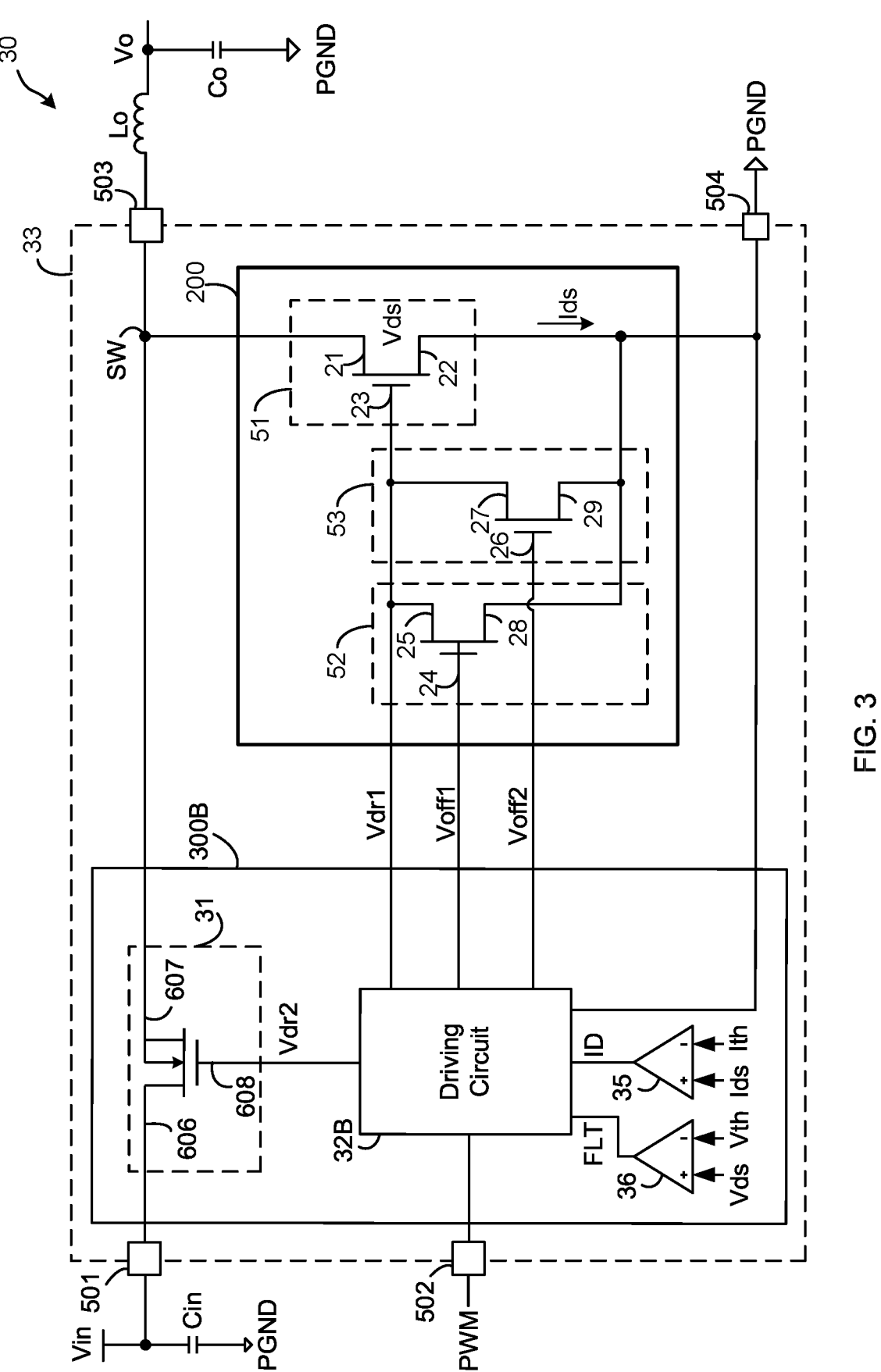
FIG. 3 schematically illustrates a switching converter 30 in accordance with an embodiment of the present invention.

FIG. 3 schematically illustrates a switching converter 30 in accordance with an embodiment of the present invention. The switching converter 30 receives an input voltage Vin and provides an output voltage Vo. As shown in FIG. 3, the switching converter 30 comprises a switching circuit formed by transistors 51-53, a transistor 31, and a driving circuit 32B. In one embodiment, the transistors 51-53 are integrated on the die 200, the driving circuit 32B and the transistor 31 are integrated on a die 300B. In one embodiment, the die 200 and the die 300B are co-packed together to form an integrated circuit (IC) 33. The IC 33 has a input supply pin 501 to receive the input voltage Vin, a pulse width modulation input pin 502 to receive the pulse width modulation signal PWM, a switching pin 503, and a reference ground pin 504 coupled to a reference ground PGND. The switching pin 503 is alternately connected to the input supply pin 501 and the reference ground pin 504 in response to states of the transistor 31 and the transistor 51. The switching pin 503 is coupled to an inductor Lo to provide the output voltage Vo. A first terminal of the inductor Lo is coupled to the switching pin 503, and a capacitor Co is coupled between a second terminal of the inductor Lo and the reference ground PGND. The output voltage Vo is formed at second terminal of the inductor Lo. A capacitor Cin is coupled between the input supply pin 501 and the reference ground PGND.

As shown in FIG. 3, the transistor 31 has a gate terminal 608 configured to receive a driving signal Vdr2, a source terminal 607 and a drain terminal 606. The drain terminal 606 is coupled to the input supply pin 501, and the source terminal 607 is coupled to the drain terminal 21 of the transistor 51 to form a switching node SW, which is coupled to the switching pin 503. That is the transistor 31 is configured as the high-side switch, and the transistor 51 is configured as the low-side switch. The switching pin 503 is configured to be alternately connected to the input supply pin 501 via the transistor 31 and connected to the reference ground PGND via the transistor 51, and the pulse width modulation signal PWM is configured to turn on the transistor 31 and the transistor 51 complementary via the driving circuit 32B. The driving circuit 32B is configured to provide the driving signal Vdr1 to control the transistor 51 and provide the driving signal Vdr2 to control the transistor 31 based on the pulse width modulation signal PWM, and the driving circuit 32B is further configured to provide the pull down control signals Voff1 and Voff2 based on the pulse width modulation signal PWM.

As shown in FIG. 3, the die 300B further comprises a comparison circuit 35 and a comparison circuit 36. The comparison circuit 35 is configured to provide the current indication signal ID based on the current Ids. In one embodiment, when the current Ids is larger than a current threshold Ith, the current indication signal ID is effective (e.g., logic high) to active soft turn-off of the transistor 51. The comparison circuit 36 is configured to provide the fault indication signal FLT based on the voltage Vds. In one embodiment, when the voltage Vds is larger than a voltage threshold Vth, the short condition between the input supply pin 501 and the switching pin 503 is detected, the fault indication signal FLT is effective (e.g., logic high) to active the soft turn-off mode of the transistor 51. In one embodiment, a current flowing through the inductor Lo or a current flowing through the transistor 31 may be used to indicate the current Ids.

Figure 4:
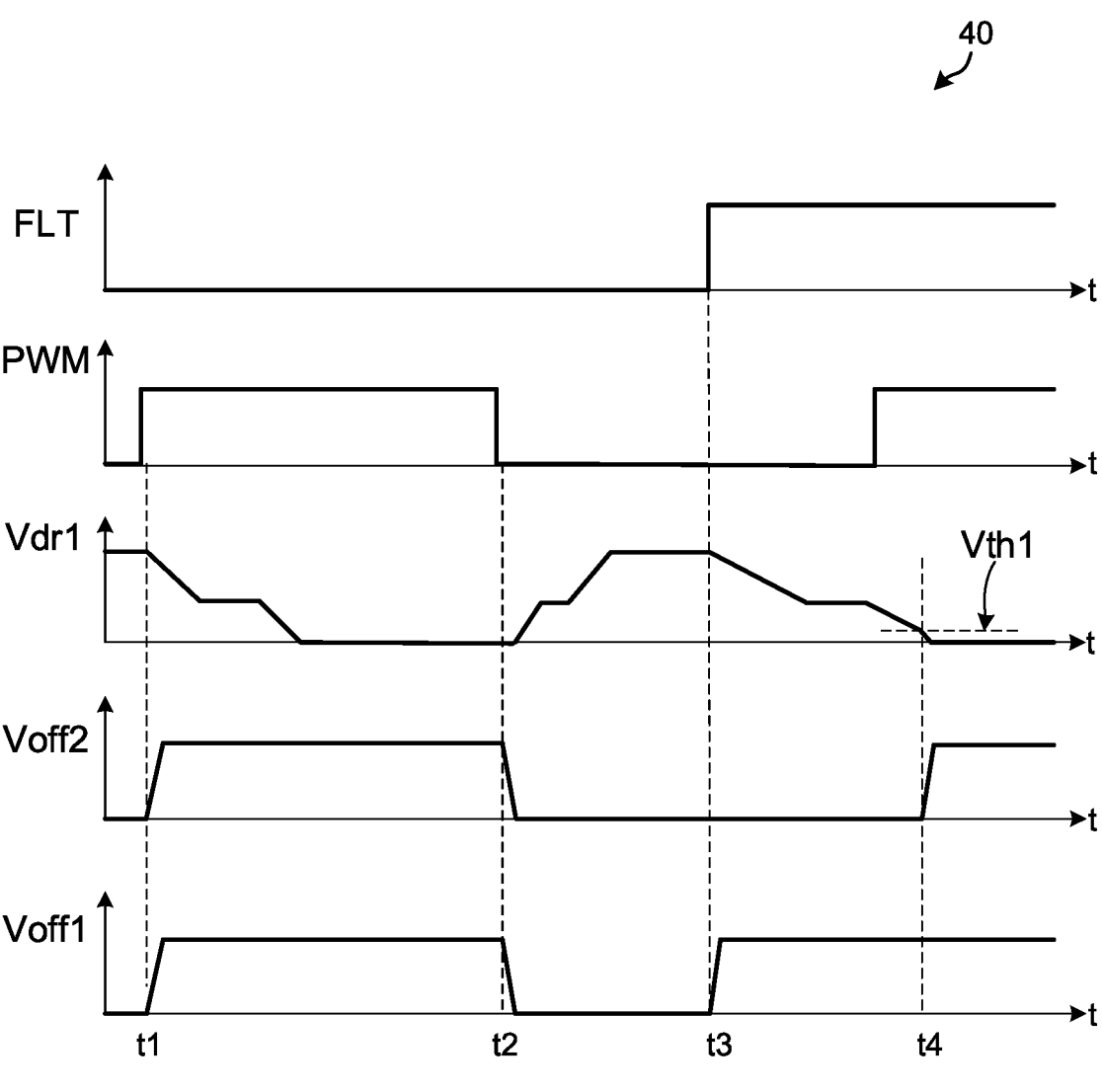
FIG. 4 illustrates a timing diagram 40 of the switching converter 30 in accordance with an embodiment of the present invention.

FIG. 4 illustrates a timing diagram 40 of the switching converter 30 in accordance with an embodiment of the present invention.

As shown in FIG. 4, at time t1, the pulse width modulation signal PWM transits to logic high to indicate that the transistor 51 should be turned off, the fault indication signal FLT is logic low to indicate that the voltage Vds is less than the voltage threshold Vth, and the transistor 51 is expected to be turned off with the normal turn-off mode. In the example of FIG. 4, the pull down control signals Voff1 and Voff2 rise up at the same time to turn on the transistors 52 and 53, the gate terminal 23 of the transistor 51 is pulled down strongly through the transistors 52 and 53. At time t2, the pulse width modulation signal PWM transits to logic low to indicate that the transistor 51 should be turned on, the transistor 52 is turned off by the pull down control signal Voff1, and the transistor 53 is turned off by the pull down control signal Voff2.

At time t3, the fault indication signal FLT is logic high to indicate that the voltage Vds is larger than the voltage threshold Vth, and the transistor 51 is expected to be turned off with the soft turn-off mode. In the example of FIG. 4, the pull down control signal Voff1 rises up first to turn on the transistor 52 for softly turning off the transistor 51. Then after a time period, e.g., when the voltage at the gate terminal of the transistor 51 is lower than a threshold Vth1 at time t4, the pull down control signal Voff2 rises up to turn on the transistor 53 to strongly clamp the gate terminal 23 of the transistor 51 to the source terminal 22, thus to suppress accidental turn-on by capacitive or inductive noise coupling during the remainder of the off state of the transistor 51.

In some examples, a voltage level between a high threshold voltage (e.g. 2V) and a voltage source (e.g. 3.3V) is considered as logic high, a voltage level between zero voltage (0 V) and a low threshold voltage (e.g. 1V) is considered as logic low. One with ordinary skill in the art should understand that the logic high and the logic low are described as one example, and may be changed without detracting from merits of the present invention.

Figure 5:
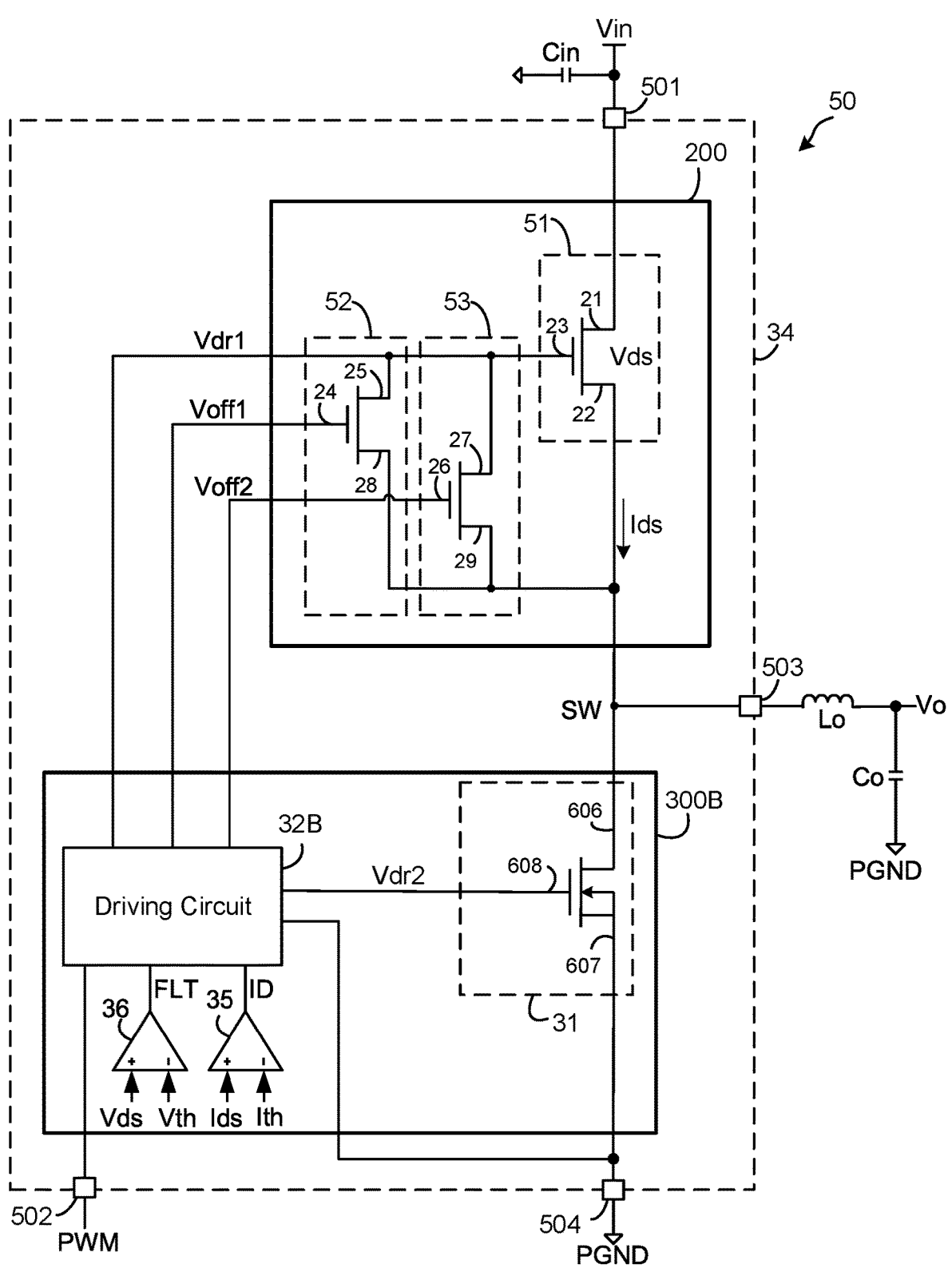
FIG. 5 schematically illustrates a switching converter 50 in accordance with an embodiment of the present invention.

FIG. 5 schematically illustrates a switching converter 50 in accordance with an embodiment of the present invention. As shown in FIG. 5, the die 200 and the die 300B are co-packed together to form an integrated circuit (IC) 34. The IC 34 has the input supply pin 501, the pulse width modulation input pin 502, the switching pin 503, and the reference ground pin 504. As shown in FIG. 5, the transistor 31 is configured as the low-side switch, and the transistor 51 is configured as the high-side switch. That is the drain terminal 21 of the transistor 51 is coupled to the input supply pin 501, and the source terminal 607 of the transistor 31 is coupled to the reference ground pin 504. The source terminal 22 of the transistor 51 is coupled to the drain terminal of the transistor 31 to form the switching node SW, which is coupled to the switching pin 503. The switching pin 503 is configured to be alternately connected to the input voltage Vin via the transistor 51 and connected to the reference ground PGND via the transistor 31.

Figure 6:
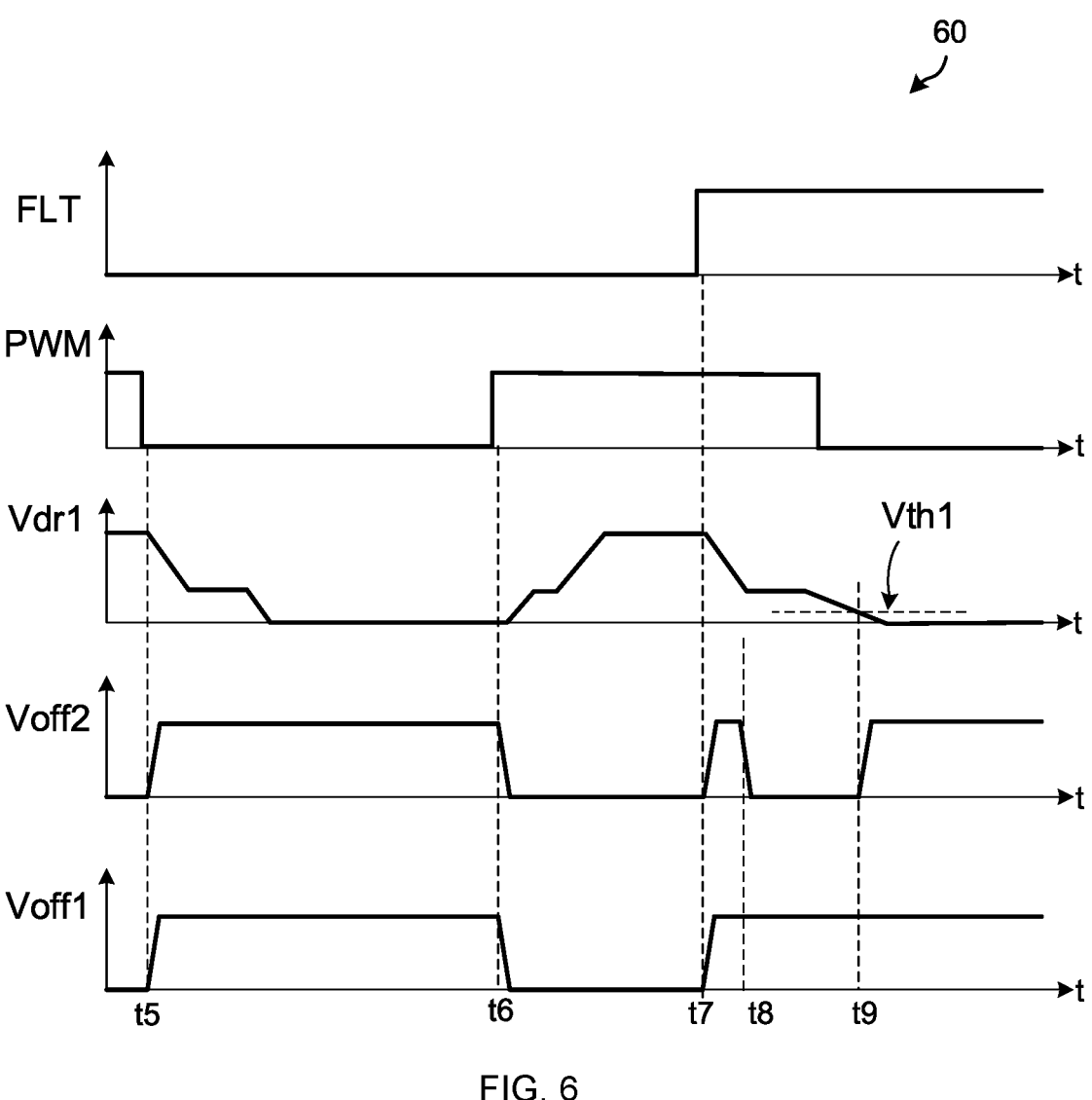
FIG. 6 illustrates a timing diagram 60 of the switching converter 50 in accordance with an embodiment of the present invention.

FIG. 6 illustrates a timing diagram 60 of the switching circuit 50 in accordance with an embodiment of the present invention.

As shown in FIG. 6, at time t5, the pulse width modulation signal PWM transits to logic low to indicate that the transistor 51 should be turned off, the fault indication signal FLT is logic low to indicate that the voltage Vds is less than the voltage threshold Vth, and the transistor 51 is expected to be turned off with the normal turn-off mode. In the example of FIG. 6, the pull down control signals Voff1 and Voff2 rise up at the same time to turn on the transistors 52 and 53, the gate terminal 23 of the transistor 51 is pulled down strongly. At time t6, the pulse width modulation signal PWM transits to logic high to indicate that the transistor 51 should be turned on, the transistor 52 is turned off by the pull down control signal Voff1, and the transistor 53 is turned off by the pull down control signal Voff2.

At time t7, the fault indication signal FLT is logic high to indicate that the voltage Vds is larger than the voltage threshold Vth, and the transistor 51 is expected to be turned off with the soft turn-off mode. In the example of FIG. 6, the pull down control signal Voff1 and the pull down control signal Voff2 rise up to turn on the transistor 52 and the transistor 53 at the same time, such that the gate terminal 23 of the transistor 51 is pulled down strongly. Then after a time period, at time t8, the pull down control signal Voff2 decreases to turn off the transistor 53 temporarily, such that the gate terminal 23 of the transistor 51 is pulled down softly. After another time period, e.g., when the voltage at the gate terminal of the transistor 51 is lower than the threshold Vth1 at time t9, the pull down control signal Voff2 rises up again to turn on the transistor 53, to strongly clamp the gate terminal 23 of the transistor 51 to the source terminal 22, thus to suppress accidental turn-on by capacitive or inductive noise coupling during the remainder of the off state of the transistor 51.

Figure 7:
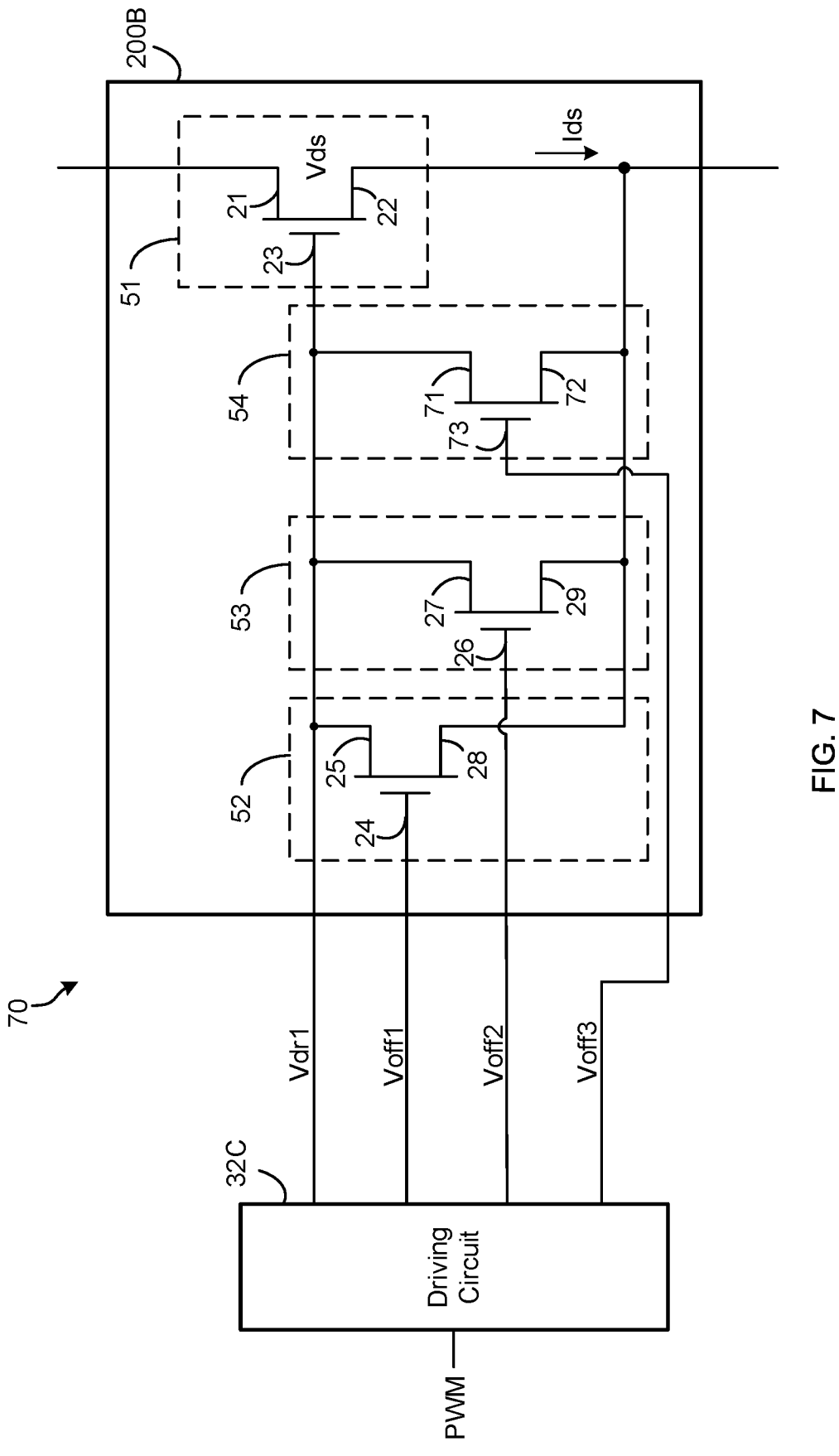
FIG. 7 schematically illustrates a switching circuit 70 in accordance with an embodiment of the present invention.

FIG. 7 schematically illustrates a switching circuit 70 in accordance with an embodiment of the present invention. The switching circuit 70 has transistors 51-54, and a driving circuit 32C. As shown in FIG. 7, the transistor 54 has a drain terminal 71, a source terminal 72 and a gate terminal 73. The drain terminal 71 of the transistor 54 is coupled to the gate terminal 23 of the transistor 51, the source terminal 72 of transistor 54 is coupled to the source terminal 22 of the transistor 51, and the gate terminal 73 of the transistor 54 is configured to receive a pull down control signal Voff3. The driving circuit 32C is configured to receive the switching control signal PWM, provide the driving signal Vdr1 and the pull down control signals Voff1-Voff3 based on the switching control signal PWM. Compared with FIG. 2, the transistor 54 coupled between the gate terminal 23 and the source terminal 22 of the transistor 51 could allow additional gate timing conditioning. In one embodiment, the transistors 51-54 are integrated on a die 200B.

FIG. 8 illustrates a control method 800 for a switching circuit in accordance with an embodiment of the present invention. The switching circuit has a first transistor, a second transistor and a third transistor, and the control method 800 has steps S11-S15.

At the step S11, receiving a pulse width modulation signal.

At the step S12, providing a driving signal based on the pulse width modulation signal to a gate terminal of the first transistor.

At the step S13, providing a first pull down control signal based on the pulse width modulation signal to a gate terminal of the second transistor, wherein a drain terminal of the second transistor is coupled to the gate terminal of the first transistor, and a source terminal of the second transistor is coupled to a source terminal of the first transistor.

At the step S14, providing a second pull down control signal based on the pulse width modulation signal to a gate terminal of the third transistor, wherein a drain terminal of the third transistor is coupled to the gate terminal of the first transistor, and a source terminal of the third transistor is coupled to the source terminal of the first transistor.

At the step S15, modifying a pull down strength of the gate terminal of the first transistor via the second transistor and the third transistor during turning off of the first transistor in response to an expected turn-off mode of the first transistor.

In one embodiment, modifying the pull down strength of the gate terminal of the first transistor further comprises: modifying a switching sequence of the second transistor and the third transistor, corresponding to turning on and turning off of the second transistor and the third transistor respectively, such that the pull down strength of the gate terminal of the first transistor respect to time is modified. In one embodiment, in response to a soft turn-off mode of the first transistor, the switching sequence of the second transistor and the third transistor comprises turning on the second transistor first to pull down the gate terminal of the first transistor with a first strength, followed by turning on the third transistor after a time period to pull down the gate terminal of the first transistor with a second strength. In another embodiment, in response to a soft turn-off mode of the first transistor, the switching sequence of the second transistor and the third transistor comprises turning on both of the second transistor and the third transistor to pull down the gate terminal of the first transistor with a first strength, followed by turning off one of the second transistor and the third transistor to pull down the gate terminal of the first transistor with a second strength temporarily, and finally turning on the one of the second transistor and the third transistor again to pull down the gate terminal of the first transistor with the first strength.

Note that in the control method 800 described above, the box functions may also be implemented with different order as shown in FIG. 8. Two successive box functions may be executed meanwhile, or sometimes the box functions may be executed in a reverse order.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

We claim:

1. A switching circuit, comprising:
a first die, having a first transistor, a second transistor, and a third transistor, wherein the first transistor has a gate terminal configured to receive a first driving signal, a source terminal, and a drain terminal, the second transistor has a gate terminal configured to receive a first pull down control signal, a drain terminal coupled to the gate terminal of the first transistor, and a source terminal coupled to the source terminal of the first transistor, and the third transistor has a gate terminal configured to receive a second pull down control signal, a drain terminal coupled to the gate terminal of the first transistor, and a source terminal coupled to the source terminal of the first transistor; and
a second die co-packed with the first die, having a fourth transistor and a driving circuit, wherein the fourth transistor has a gate terminal configured to receive a second driving signal, a source terminal and a drain terminal, the driving circuit is configured to receive a pulse width modulation signal, and provide the first driving signal, the second driving signal, the first pull down control signal and the second pull down control signal based on the pulse width modulation signal; wherein
the first transistor is coupled to the fourth transistor to form a switch node, which is capable of alternately connecting to an input voltage and a reference ground in response to turning on and off of the first and fourth transistors respectively.

2. The switching circuit of claim 1, wherein a switching sequence of the second transistor and the third transistor, corresponding to turning on and turning off of the second transistor and the third transistor respectively, is configured to be modified such that the pull down strength of the gate terminal of the first transistor respect to time is modified.

3. The switching circuit of claim 2, wherein in response to a soft turn-off mode of the first transistor, the switching sequence of the second transistor and the third transistor comprises: turning on the second transistor first to pull down the gate terminal of the first transistor with a first strength, followed by turning on the third transistor after a time period to pull down the gate terminal of the first transistor with a second strength, and wherein the second strength is higher than the first strength.

4. The switching circuit of claim 2, wherein in response to a soft turn-off mode of the first transistor, the switching sequence of the second transistor and the third transistor comprises: turning on both of the second transistor and the third transistor to pull down the gate terminal of the first transistor with a first strength, followed by turning off one of the second transistor and the third transistor to pull down the gate terminal of the first transistor with a second strength temporarily, and finally turning on the one of the second transistor and the third transistor again to pull down the gate terminal of the first transistor with the first strength.

5. The switching circuit of claim 1, wherein during turning off of the first transistor, a pull down strength of the first transistor is capable of being modified via the second transistor and the third transistor based on an expected turn-off mode of the first transistor, the expected turn-off mode is configured to be responsive to a current flowing through the drain terminal and the source terminal of the first transistor and a voltage across the drain terminal and the source terminal of the first transistor.

6. The switching circuit of claim 1, further comprising:
a pulse width modulation input pin, configured to receive the pulse width modulation signal;
an input supply pin, configured to receive the input voltage; and
a switching pin, configured to be coupled to an inductor to provide an output voltage; and
a reference ground pin, configured to be coupled to a reference ground; wherein
the drain terminal of the first transistor is coupled to the input supply pin, the source terminal of the first transistor and the drain terminal of the fourth transistor are coupled to the switching pin, and the source terminal of the fourth transistor is coupled to the reference ground pin.

7. The switching circuit of claim 1, further comprising:
a pulse width modulation input pin, configured to receive the pulse width modulation signal;
an input supply pin, configured to receive the input voltage; and
a switching pin, configured to be coupled to an inductor to provide an output voltage; and
a reference ground pin, configured to be coupled to a reference ground; wherein
the drain terminal of the fourth transistor is coupled to the input supply pin, the source terminal of the fourth transistor and the drain terminal of the first transistor are coupled to the switching pin, and the source terminal of the first transistor is coupled to the reference ground pin.

8. The switching circuit of claim 1, wherein the first die further comprising:
a fifth transistor, having a gate terminal configured to receive a third pull down control signal, a drain terminal coupled to the gate terminal of the first transistor and a source terminal coupled to the source terminal of the first transistor; wherein
the driving circuit is further configured to provide the third pull down control signal based on the pulse width modulation signal.

9. The switching circuit of claim 1, wherein the second transistor has a larger size and a lower resistance than the third transistor.

10. A switching circuit, comprising:
a first die, having a first transistor, a second transistor, and a third transistor, wherein the first transistor has a gate terminal configured to receive a first driving signal, a source terminal, and a drain terminal, the second transistor has a gate terminal configured to receive a first pull down control signal, a drain terminal coupled to the gate terminal of the first transistor, and a source terminal coupled to the source terminal of the first transistor, and the third transistor has a gate terminal configured to receive a second pull down control signal, a drain terminal coupled to the gate terminal of the first transistor, and a source terminal coupled to the source terminal of the first transistor; and
a second die co-packed with the first die, having a driving circuit, wherein the driving circuit is configured to receive a pulse width modulation signal, and provide the first driving signal, the first pull down control signal and the second pull down control signal based on the pulse width modulation signal; wherein
the first transistor is coupled to a fourth transistor to form a switch node, which is capable of alternately connecting to an input voltage and a reference ground in response to turning on and off of the first and fourth transistors respectively; and wherein the second transistor has a larger size and a lower resistance than the third transistor.

11. The switching circuit of claim 10, wherein during a time period that the pulse width modulation signal turns off the first transistor, a switching sequence of the second transistor and the third transistor, corresponding to turning on and turning off of the second transistor and the third transistor respectively, is controlled based on a current flowing through the drain terminal and the source terminal of the first transistor and a voltage across the drain terminal and the source terminal of the first transistor.

12. The switching circuit of claim 10, wherein the driving circuit is further configured to receive a current indicating signal and a fault indicating signal, the current indicating signal is provided based on comparing a current flowing through the drain terminal and the source terminal of the first transistor with a current threshold, and the fault indicating signal is provided based on comparing a voltage across the drain terminal and the source terminal of the first transistor with a voltage threshold.

13. The switching circuit of claim 12, wherein during a time period that the pulse width modulation signal turns off the first transistor, the driving circuit is configured to control a switching sequence of the second transistor and the third transistor based on the current indicating signal and the fault indicating signal.

14. The switching circuit of claim 10, wherein the second die further comprises:

the fourth transistor, having a gate terminal, a source terminal and a drain terminal, wherein the driving circuit is configured to provide a second driving signal to the gate terminal of the fourth transistor based on the pulse width modulation signal.

15. The switching circuit of claim 14, further comprising:

a pulse width modulation input pin configured to receive the pulse width modulation signal;

an input supply pin configured to receive the input voltage; and a switching pin configured to be coupled to an inductor to provide an output voltage; and a reference ground pin configured to be coupled to a reference ground; wherein the drain terminal of the first transistor is coupled to the input supply pin, the source terminal of the first transistor and the drain terminal of the fourth transistor are coupled to the switching pin, and the source terminal of the fourth transistor is coupled to the reference ground pin.

16. The switching circuit of claim 14 further comprising:

a pulse width modulation input pin, configured to receive the pulse width modulation signal;

an input supply pin, configured to receive the input voltage; and a switching pin, configured to be coupled to an inductor to provide an output voltage; and a reference ground pin, configured to be coupled to a reference ground; wherein the drain terminal of the fourth transistor is coupled to the input supply pin, the source terminal of the fourth transistor and the drain terminal of the first transistor are coupled to the switching pin, and the source terminal of the first transistor is coupled to the reference ground pin.

* * * * *